United States Patent Office 3,573,114
Patented Mar. 30, 1971

3,573,114

ELECTROLUMINESCENT JUNCTIONS BY CO-DOPING WITH MORE THAN ONE ELEMENT

John C. Marinace, Yorktown Heights, N.Y., assignor to the United States of America as represented by the Secretary of the Army No Drawing. Filed Jan. 9, 1969, Ser. No. 790,158
Int. Cl. H01l 7/44
U.S. Cl. 148—189 5 Claims

ABSTRACT OF THE DISCLOSURE

This invention relates to a method of fabricating a light emitting semiconductor junction device. The method encompasses diffusing zinc and cadmium together into n-type gallium-arsenide wafers that are sealed in a silica tube or ampule with approximately 5 mg. $Cd_3As_2$ or $CdAs_2$ plus approximately 5 mg. of $ZnAs_2$. For diodes fabricated by this method of co-diffusion, the silica tube is heated to 750° C. for 4 hours then to 850° C. for .75 hour. For lasers fabricated by this co-diffusion, the tube is heated to 750° C. for 16 hours and then to 850° C. for 1.25 hours.

The present invention relates to a method of fabricating an electro-luminescent junction by co-doping with more than one element. More particularly, the present invention relates to a method of fabricating a light emitting semiconductor junction by co-diffusing Zn and Cd into an n-type GaAs wafer.

Heretofore, electroluminescent junctions in semiconductors, for example GaAs, have been fabricated by doping with a donor element in the n-type region and with an acceptor element in the p-type region. This has been accomplished in the past by diffusing Zn, an acceptor into an n-type GaAs substrate doped with Se, Te, or Sn donors. Although it would seem that Cd or other Group II elements ought to be adequate substitutes for Zn, for some reason they are not and Mg, Ca and Hg are even poorer than Cd.

The method of the instant invention produces an electroluminescent junction that is superior to those heretofore developed, particularly those junctions produced by the diffusion of Zn alone.

Briefly, n-type GaAs wafers are placed in a silica tube 75 mm. long and having an inside diameter of 11 mm. The n-type wafers are preferably doped with Sn in the range of $1 \times 10^{18}$ to $3 \times 10^{18}$ Sn atoms/cm.$^3$, and preferably of [100] orientation. One surface of the wafer is chemically polished until it is smooth and damage-free. The silica tubes are then sealed off with 5 mg. of $Cd_3As_2$ or $CdAs_2$ plus 5 mg. of $ZnAs_2$ inside. The tube is then placed in a furnace where it is heated at 750° C. for 16 hours then 850° C. for 1.25 hours for lasers. For electroluminescent diodes, the 750° C. period is 4 hours and the 850° C. period is 0.75 hour. The wafers are subsequently removed from the silica tubes, cooled, and lapped to approximately 4 mils. Ohmic contacts of gold, tin, and indium are plated onto the wafer surfaces in a conventional manner. The wafers are then divided into individual diode chips by cleaving or sawing and then mounted on conventional headers. The above diffusion of the Cd and Zn can be performed sequentially in either order or can be performed simultaneously.

Lasers made by the co-diffusion of Zn and Cd usually have 77° K. threshold current densities 20% lower than when Zn alone is diffused. CW peak power output is usually 10% higher. The improvement of the instant invention is greater for spontaneous emission in electroluminescent diodes. External quantum efficiencies are obtainable at room temperature from 30% to 100% higher for the diodes made by the co-diffusion of Zn and Cd compared with diodes made by the diffusion of Zn only.

The combination of Zn with Fe, Mn, Au, and Cu, individually can be used. Results for Zn plus Fe are similar to those of Zn plus Cd; however, life-test degradation for Zn plus Fe is greater than for Zn plus Cd. For Zn plus Mn and Zn plus Au, spontaneous emission efficiencies are substantially equal to those of the instant invention. Zn plus Cu yield diodes with spontaneous emission efficiencies about a factor of ten lower than those of the instant invention.

It should be understood, of course, that the foregoing disclosure relates to only a preferred embodiment of the invention and that numerous modifications or alterations may be made therein without departing from the spirit and scope of the invention as set forth in the appended claims.

What is claimed is:

1. A method of fabricating electroluminescent junctions comprising the steps of:
providing a semiconductor wafer;
diffusing cadmium and zinc into said wafer thereby producing said electroluminescent junction.

2. A method of fabricating electroluminescent junctions according to claim 1, and further providing that said step of diffusing includes the step of applying heat first at approximately 750° C. and subsequently applying heat at approximately 850° C.

3. A process for fabricating a light-emitting semiconductor comprising the steps of:
providing a semiconductor wafer of GaAs;
sealing said wafer in an ampule containing approximately 5 mg. of $Cd_3As_2$ or $CdAs_2$ and approximately 5 mg. $ZnAs_2$;
heating said ampule at approximately 750° C. for a first predetermined period of time;
subsequently heating said ampule at approximately 850° C. for a second predetermined period of time;
thereby producing a light-emitting semiconductor.

4. The method according to claim 3 wherein said first predetermined period of time is approximately 4 hours and said second predetermined period of time is approximately .75 hour.

5. The method according to claim 3 wherein said first predetermined period of time is approximately 16 hours and said second predetermined period of time is approximately 1.25 hours.

References Cited

UNITED STATES PATENTS

| | | | |
|---|---|---|---|
| 3,416,047 | 12/1968 | Beale et al. | 317—234 |
| 3,427,211 | 1/1969 | Foster et al. | 317—235 |
| 3,483,096 | 12/1969 | Gri et al. | 317—235 |

L. DEWAYNE RUTLEDGE, Primary Examiner

R. A. LESTER, Assistant Examiner

U.S. Cl. X.R.

29—572; 148—186; 317—234